(12) United States Patent
Calvanese Strinati et al.

(10) Patent No.: US 8,301,966 B2
(45) Date of Patent: Oct. 30, 2012

(54) DISTRIBUTED TURBOCODER FOR BLOCK-FADING CHANNELS

(75) Inventors: Emilio Calvanese Strinati, Grenoble (FR); Antonio De Domenico, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 579 days.

(21) Appl. No.: 12/581,075

(22) Filed: Oct. 16, 2009

(65) Prior Publication Data

US 2010/0115373 A1 May 6, 2010

(30) Foreign Application Priority Data

Oct. 22, 2008 (FR) ...................................... 08 57166

(51) Int. Cl.
*G06F 11/00* (2006.01)
(52) U.S. Cl. ...................................................... 714/755
(58) Field of Classification Search ................... 714/755
See application file for complete search history.

(56) References Cited

U.S. PATENT DOCUMENTS

| | | | | |
|---|---|---|---|---|
| 2003/0110438 A1* | 6/2003 | Pan et al. | ....................... | 714/755 |
| 2004/0202138 A1* | 10/2004 | Song et al. | ....................... | 370/335 |
| 2005/0111347 A1* | 5/2005 | Breiling et al. | ............... | 370/206 |
| 2008/0065946 A1 | 3/2008 | Choi et al. | | |

FOREIGN PATENT DOCUMENTS

| | | | |
|---|---|---|---|
| FR | 2800947 | A | 5/2001 |
| WO | 2007064249 | A | 6/2007 |
| WO | 2008109912 | A | 9/2008 |

OTHER PUBLICATIONS

European Search Report for EP 09172038, mailed Nov. 6, 2009.
Valenti, M. C. et al., "Distributed Turbo Codes: Towards the Capacity of the Relay Channel," IEEE, 2003, pp. 323-326.
Zhao, B. et al., "Distributed Turbo Coded Diversity for Relay Channel," Electronics Letters, May 15, 2003, vol. 39, No. 10.
Laneman, J. N. et al., "Exploiting Distributed Spatial Diversity in Wireless Networks," In Proc. Allerton Commun. Contr. Computing, (Illinois), Oct. 2000, (invited paper), pp. 1-10.
Berrou, C. et al., "Near Shannon Limit Error—Correcting Coding and Decoding: Turbo-Codes (1)," IEEE, 2003, pp. 1064-1070.
Divsalar, D. et al., "Multiple Turbo Codes," Jet Propulsion Laboratory, California Institute of Technology, Pasadena, CA.
Janani, M. et al., "Coded Cooperation in Wireless Communications: Space-Time Transmission and Iterative Decoding," IEEE Transactions on Signal Processing, vol. 52, No. 2, Feb. 2004, pp. 362-369.

\* cited by examiner

*Primary Examiner* — Bryce Bonzo
(74) *Attorney, Agent, or Firm* — Nixon Peabody LLP (57) ABSTRACT

A cooperative communications system comprising a source terminal, at least one relay terminal and a destination terminal. The system also comprises a distributed turbocoder over the source terminal and at least the relay terminal. The first part of the turbocoder residing on the source terminal and/or the second part of the turbocoder residing on the relay terminal is(are) equipped with a frequency scheduler ($FS_r, FS_s$) allocating the deeper-fading carriers to the systematic information data and the weaker-fading carriers to the parity data.

8 Claims, 6 Drawing Sheets

DISTRIBUTED TURBOCODER FOR BLOCK-FADING CHANNELS

CROSS REFERENCE TO RELATED APPLICATIONS OR PRIORITY CLAIM

This application claims priority of French Patent Application No. 08 57166, filed Oct. 22, 2008.

DESCRIPTION

1. Technical Field

The present invention relates in general to communications systems of cooperative type, and applies especially to 3GPP LTE, Wi-MAX, 3GPP LTE-Advanced systems and wireless local networks (WLANs).

2. Prior Art

Wireless communications systems of cooperative type are known to offer greater coverage and have less susceptibility to fading than conventional cellular systems. A description of wireless systems of cooperative type can be found for example in the article by J. N Lanemann and G. W. Wornell entitled "Exploiting distributed spatial diversity in wireless networks" published in October 2000 in Proc. Allerton Conf. on Comm., Contr., Computing.

Figure 1:
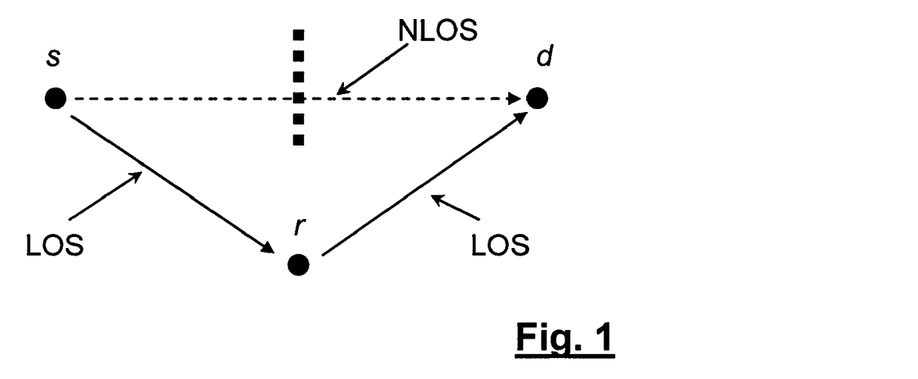
FIG. 1 schematically illustrates a wireless telecommunications system of cooperative type.

FIG. 1 schematically illustrates a cooperation strategy in such a system. The source terminal s transmits a data flow to a destination terminal d. The terminal r also receives the data flow originating from s and relays it to the destination terminal d. The terminal r thus cooperates in transmission of data between s and d. For example, if the channel s-d is poor quality, for example due to the presence of an obstacle between s and d or fading, the channel s-r-d can rectify it and produce a satisfactory liaison quality. The data flow can be relayed by several terminals to further augment the spatial diversity of the transmission trajectories. Also, it can be relayed a single time (single-hop) or several times (multiple-hop). After amplification, the relay can manage to retransmit the signal it receives from the source (protocol known as AF for Amplify and Forward) or else previously decode the signal prior to resending it (protocol known as DF for Decode and Forward).

In another telecommunications field, the turbocodes introduced by C. Berrou et al. in the seminal article entitled "Near Shannon limit error-correcting coding and decoding: Turbo Codes", Proceedings of ICC'93 pp. 1064-1070, have been the focus of numerous research efforts. The remarkable performances of the turbocodes in terms of bit error rate or BER (Bit Error Rate), close to those of random coding, are explained by the presence of one or more interleaver(s) between different elementary coders.

Figure 2:
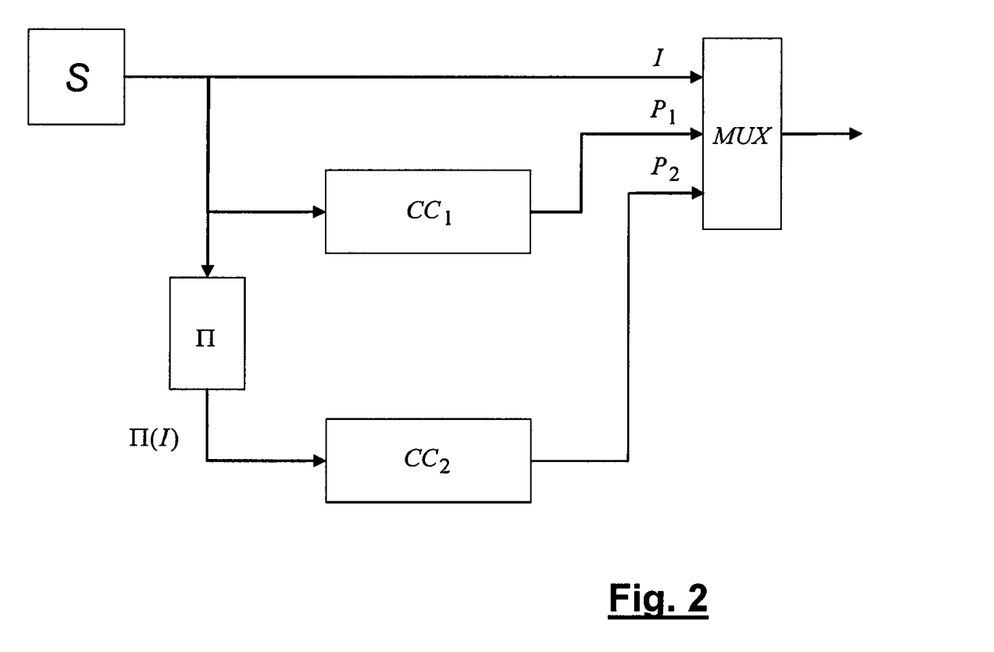
FIG. 2 schematically illustrates the structure of a turbocoder known from the state of the art.

FIG. 2 illustrates an example of the structure of a turbocoder. The information bits I originating from the source S are coded by two elementary coders of systematic convolutive type, arranged in parallel. Each of its elementary coders ($RSC_1$,$RSC_2$) is constituted by a systematic path, by definition leaving the information bits I unchanged, and by a convolutive coder ($CC_1$,$CC_2$). The convolutive coder $CC_1$ provides the parity bits $P_1$ as a function of the information bits I. The convolutive coder $CC_2$ however provides parity bits $P_2$ as a function of the information bits previously interleaved by the interleaver Π. A multiplexer MUX then multiplexes the bits I, $P_1$, $P_2$ on the transmission channel.

More generally, a turbocoder (of parallel type) results from parallel concatenation of a plurality of systematic convolutive coders $RSC_1$, . . . , $RSC_N$, identical or not, whereof the inputs are interleaved by distinct interleaving laws. A description of such a turbocoder is found in the article by D. Divsalar et al. entitled "Multiple turbo codes" published in Proc. IEEE MIL-COM pp. 279-285, 1995. The number N of elementary coders is known as the dimension of the turbocode. The performances of the turbocode are intrinsically associated with the characteristics of the interleaving laws. It is understood in fact that the more chaotic these are, the greater the constraint length of the code and the more robust the code is to noise.

The idea of making a distributed turbocoder between a source terminal and a relay terminal of a cooperative system has been proposed recently by M. Janani et al. in the article entitles "Coded cooperation in wireless communications: space-time transmission and iterative decoding" published in IEEE Trans. Signal Process., vol. 52, No. 2, pp. 362-371, February 2004.

Figure 3:
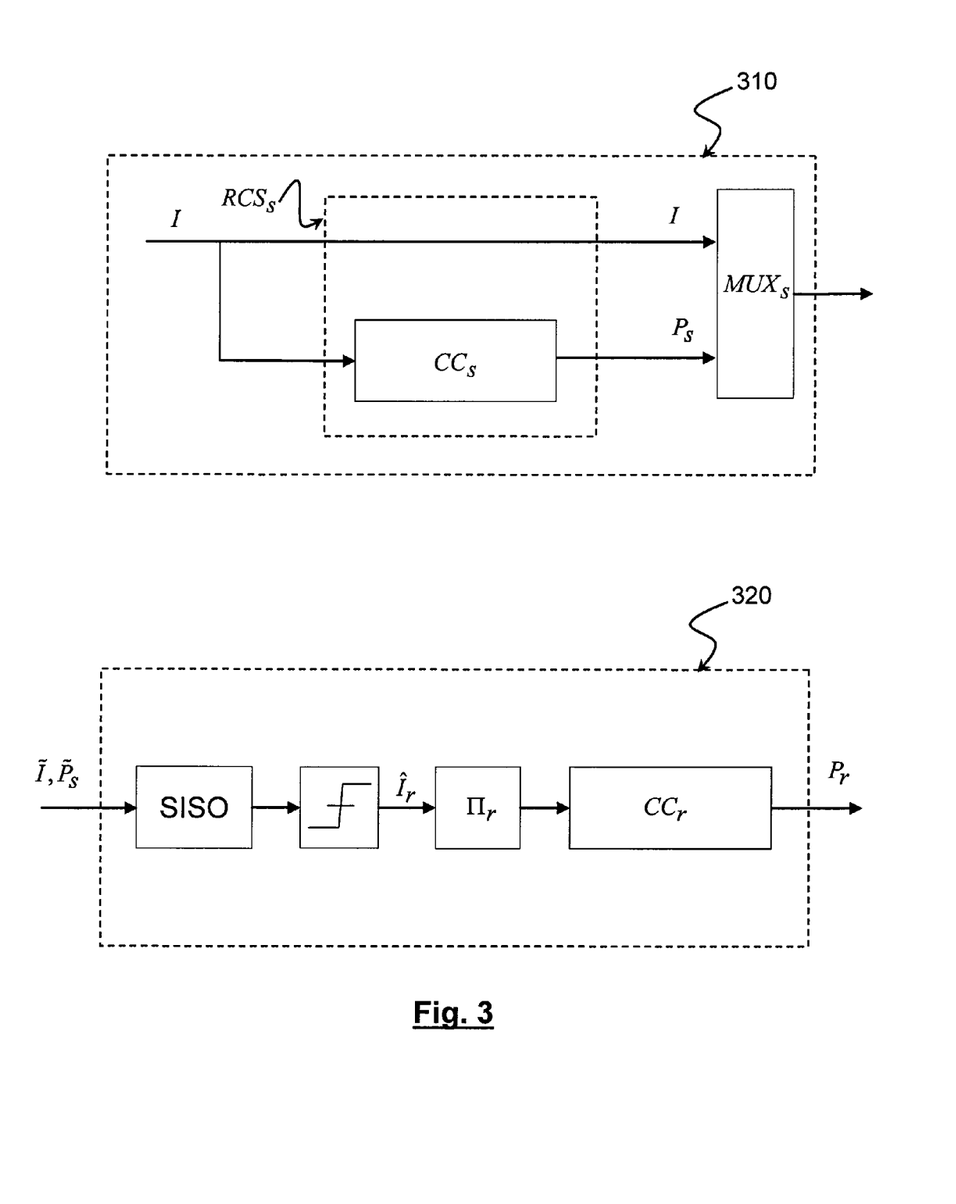
FIG. 3 schematically illustrates the structure of a distributed turbocoder known from the state of the art.

FIG. 3 schematically illustrates the structure of a distributed turbocoder between a source terminal s and a relay terminal r. The parts of the turbocoder residing respectively on the source terminal and on the relay terminal are distinguished at 310 and 320.

The source terminal s comprises a first systematic convolutive coder $RCS_s$. The information bits I are left unvaried by the systematic path of the coder $RCS_s$ and coded by the convolutive coder $CC_s$ into parity bits designated here by $P_s$. A muliplexer $MUX_s$ multiplexes the bits I and $P_s$ prior to transmission.

The relay terminal r receives the flow of bits thus multiplexed and estimates the information bits I by means of a Viterbi decoder with flexible outputs known as SOVA (Soft Output Viterbi Algorithm). In terms of decoding, a hard decision is made on the soft values of the bits thus decoded. The hard values, noted here as $\hat{I}_r$, are then interleaved in an interleaver $\Pi_r$ before being coded in a second convolutive coder $CC_r$. The parity bits $P_r$ provided by the second coder are then transmitted to the destination terminal d.

It is understood that the coders $CC_s$ and $CC_r$ here play the same role as the convolutive coders $CC_1$ and $CC_2$ in the turbocoder of FIG. 2; in other words the parts 310 and 320 conjointly carry out turbocoding of the information bits I.

The destination terminal d receives the information bits I and the parity bits $P_s$ from the source terminal on the one hand and on the other hand the parity bits $P_r$ from the relay terminal. The flow of bits received is subjected to iterative decoding using the same number of decoders as elementary coders in the distributed turbocoder, in which the decoders update and exchange the extrinsic values relative to the different information bits. In the present case the destination terminal comprises two decoders of SISO type (Soft In Soft Out), for example decoders of MAP type (Maximum A Posteriori) or of SOVA type (Soft Output Viterbi Decoder).

This type of distributed turbocoding functions well when the transmission channels are gaussian and more precisely of AWGN type (Additive White Gaussian Noise). An AWGN channel is modelled by a transmission coefficient and a noise variance. In practice however, the transmission channels of wireless transmission systems undergo fading (Rayleigh fading) which can severely limit performance of the turbocode in terms of BER for a given signal to noise ratio. More precisely, the channel can be modelled as variable over time, exhibiting instances of weak fading and instances of strong fading (deep fading).

Other examples of communications systems are described in the following documents of the prior art:

WO 2008/109912, FR 2 800 947, US 2008/065946, WO 2007/064249, the article by VALENTI M C et al.: "Distributed turbo codes: towards the capacity of the relay channel" VEHICULAR TECHNOLOGY CONFERENCE, 2003.

VTC 2003-FALL. 2003 IEEE 58th ORLANDO, Fla., USA 6-9 Oct. 2003; IEEE VEHICULAR TECHNOLOGY CONFERENCE, PISCATAWAY, N.J., USA, IEEE, US, Oct. 6, 2003 (2003-10-06), pages 322-326 Vol, XP010700782 ISBN: 978-0-7803-7954-1; and the article by ZHAO B et al.: "Distributed turbo coded diversity for relay channel" ELECTRONICS LETTERS, IEE STEVENAGE, GB, vol. 39, no. 10, May 15, 2003 (2003-05-15), pages 786-787, XP006020339 ISSN: 0013-5194.

An aim of the present invention is therefore to propose a structure of distributed turbocoder which is more resistant in terms of BER rate to fading of the transmission channel (source-destination and relay-destination) than the distributed turbocoders of the prior art.

EXPLANATION OF THE INVENTION

The present invention is defined by a cooperative communications system comprising a source terminal, at least one relay terminal, and a destination terminal, the source terminal being adapted to transmit information data to the destination terminal on a first multi-carrier transmission channel, said system comprising a distributed turbocoder between said source terminal and at least said relay terminal, the part of the turbocoder residing on the source terminal, referred to as first part, comprising a first systematic path and at least a first convolutive coding path coding said information data to generate first parity data, the relay terminal estimating said information data from a signal received from the source terminal, the part of the turbocoder residing on the relay terminal, referred to as said second part, comprising a second systematic path providing the information data thus estimated and a second convolutive coding path coding the latter after having interleaved them to generate second parity data, said estimated data and said second parity data being transmitted on a second multi-carrier transmission channel. Said system comprises at least one frequency scheduler residing on the source terminal or the relay terminal, said scheduler allocating the carriers exhibiting deep fading to the data originating respectively from the first or the second systematic path and the carriers exhibiting weak fading to the data originating respectively from the first or second convolutive coding path.

According to a first embodiment, the cooperative communications system comprises a first frequency scheduler residing on the source terminal and receiving at input said systematic information data and said first parity data and allocating the deep fading carriers to the first and the weak fading carriers to the second.

It can also comprise a second frequency scheduler residing on the relay terminal and receiving at input said estimated systematic information data and said second parity data and allocating the deep-fading carriers to the first and the weak-fading carriers to the second.

According to a first variant, the partition between weak-fading carriers and deep-fading carriers utilised by the second scheduler is determined by the source terminal and information indicative of this partition is transmitted to the relay terminal.

Said partition can then be determined by the source terminal from a channel quality indicator sent by the destination terminal.

According to a second embodiment, the partition between weak-fading carriers and deep-fading carriers utilised by the second scheduler is determined autonomously by the relay terminal.

Said partition can then be determined by the relay terminal from a channel quality indicator sent by the destination terminal.

According to a preferred embodiment, the multicarrier first and second channels are OFDM channels.

BRIEF DESCRIPTION OF THE DRAWINGS

Other characteristics and advantages of the invention will emerge from a preferred embodiment of the invention given in reference to the attached figures, in which.

DETAILED EXPLANATION OF SPECIFIC EMBODIMENTS

Hereinbelow we will consider a cooperative communications system comprising a source terminal s, at least one relay terminal r, and a destination terminal d. The expression "source terminal" must be taken in the broad sense, the present invention being especially able to relate to the case where a base station transmits data to the terminal of a user on its downlink. In the same way the expression "destination terminal" must be understood in broad terms, the present invention also relating to the case where a source terminal transmits data to a base station on its uplink. In the two cases in point, the data are relayed by the relay terminal, either to the base station for the uplink, or to the terminal of the user for the downlink.

The transmission channels will be supposed to be of block-fading type (block-fading channel), a realistic hypothesis for modelling the majority of wireless connections. In a block-fading channel, a message to be transmitted, for example a code word, sees a plurality of channel instances. These instances can be time and/or frequential according to whether the channel is selective in time or in frequency. Hereinbelow we will consider that transmission is carried out by means of a multi-carrier signal, for example by means of OFDM multiplexing (Orthogonal Frequency Division Multiplexing). In this case, if $N_c$ is the number of carriers (more precisely of sub-carriers in the case of OFDM transmission), the channel instances seen by a code word are frequency blocks or "frequency chunks" substantially undergoing the same fading.

Figure 4:
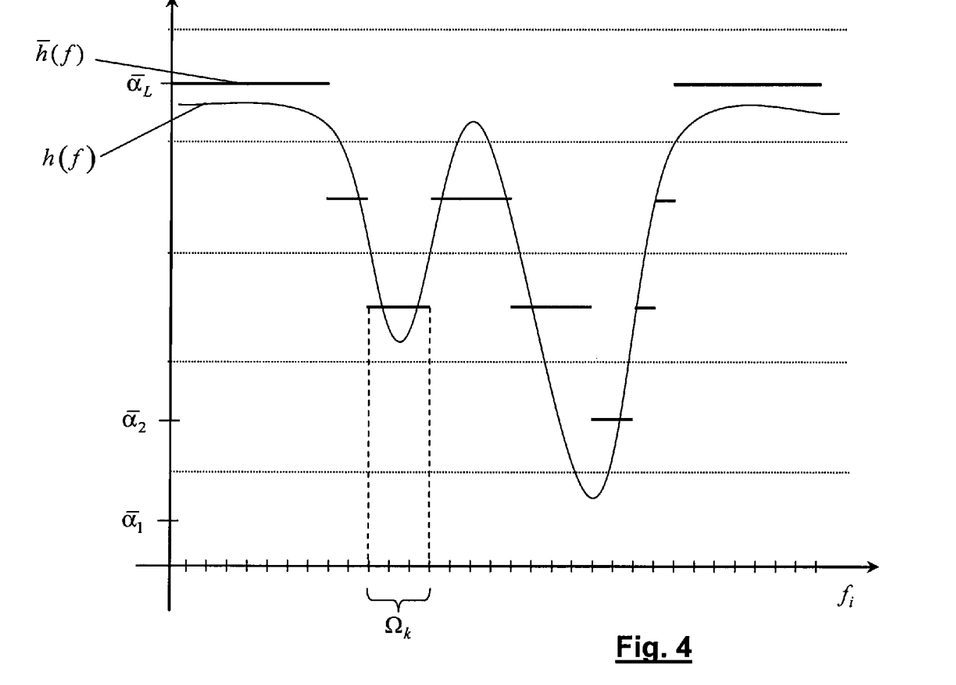
FIG. 4 illustrates the state of a block-fading multi-carrier transmission channel.

By way of illustration FIG. 4 illustrates the state of an OFDM block-fading transmission channel at any given instant. The transfer function $h(f)$ of the channel can be quantified by means of a plurality L of levels of quantification noted as $\bar{\alpha}_1, \ldots, \bar{\alpha}_L$, also called frequential instances of the channel. The transfer function of the channel can then be approximated by a quantified function $\bar{h}(f)$. The contiguous carriers $f_i$ whereof the respective quantified transmission coefficients $\bar{h}(f)$ are of same value can be grouped in the form of an interval. Thus the function $\bar{h}(f)$ can be considered as a function defined by intervals $\Omega_1, \ldots, \Omega_K$ where $$\Omega = \bigcup_{k=1}^{K} \Omega_k$$

is the set of all the carriers. Two disjointed intervals can correspond to a same frequential instance. By construction, two adjacent intervals $\Omega_k, \Omega_{k+1}$ correspond to distinct instances. An interval $\Omega_k$ can be reduced to a singleton.

In the case illustrated in FIG. 4, the channel is defined by five channel instances (L=5) and nine carrier intervals (K=9).

It should be noted that in general the state of the channel could vary from one code word to the other; in other words the function $\bar{h}(f)$ is not necessarily constant over time.

Figure 5:
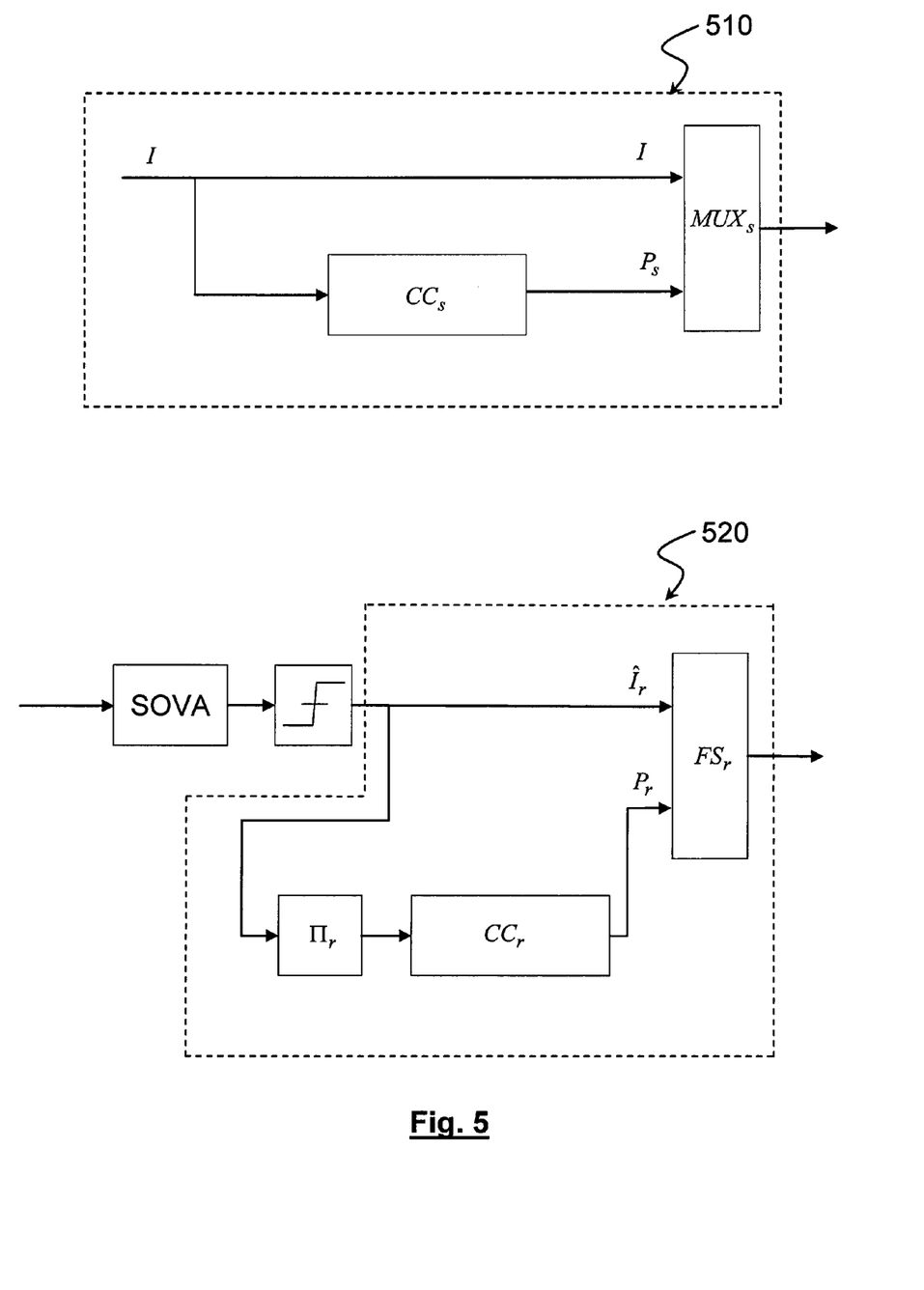
FIG. 5 schematically illustrates the structure of a distributed turbocoder with frequency scheduling according to a first variant embodiment of the invention.

FIG. 5 illustrates a first embodiment of a distributed turbocoder according to a first embodiment of the invention. The part of the turbocoder residing on the source terminal s is illustrated at 510 and that residing on the relay terminal r is illustrated at 520.

The first part 510 comprises a first systematic path providing directly the information bits I and a first convolutive coding path providing first parity bits $P_s$. The first convolutive coding path receives the information bits I and the code by means of a first convolutive coder $CC_s$. The coder $CC_s$ is more precisely a convolutive coder of recursive type.

A multiplexer $MUX_s$ alternatively selects a systematic information bit and a parity bit. The bits at the output of the multiplexer are then transformed into symbols of a modulation alphabet by means of an M-ary to symbol modulator (not shown) before the different carriers are modulated. In the event of BPSK modulation (Binary Phase Shift Keying), each BPSK symbol modulates a different frequency and therefore each systematic information bit or parity bit is therefore associated with a different carrier. The multi-carrier signal, for example the OFDM signal, can be translated into RF band, if needed.

The relay terminal r receives the multi-carrier signal from the source terminal, if required after having performed translation to base band. Demodulation of the multi-carrier signal recovers the soft values $(\tilde{I}, \tilde{P}_s)$ of the systematic information bits and parity bits. These soft values are fed to a decoder of SISO type corresponding to the convolutive coder of the source terminal, for example a soft output Viterbi decoder (SOVA).

The SISO decoder provides en sortie des soft values systematic information bits $\tilde{I}$. These soft values are subjected to a hard decision to provide estimated bits $\hat{I}_r$.

The second part 520 of the distributed turbocoder receives the systematic information bits thus estimated. It itself comprises a second systematic path directly providing the estimated bits $\hat{I}_r$ and a second convolutive coding path providing second parity bits $P_r$. The second convolutive coding path receives the estimated bits, interleaves them by means of an interleaver $\Pi$, and codes the thus interleaved bits by means of a convolutive coder $CC_r$. The coder $CC_r$ is more precisely a convolutive coder of recursive type.

The second systematic paths and convolutive coding paths feed the bits $\hat{I}_r$ and $P_r$ to a frequency scheduler $FS_r$ which allocates them carriers according to an allocation rule described in detail hereinbelow. The M bits allocated to a carrier are transformed into a symbol of the modulation alphabet by means of an M-ary to symbol modulator (not shown) and the symbols thus obtained modulate the different carriers. The resulting multi-carrier signal is transmitted by the relay terminal, if required after translation to RF frequency.

The aim of the frequency allocation strategy is to transmit the parity bits $P_r$ to the carriers exhibiting weak fading and the systematic bits to the carriers exhibiting deeper fading. Otherwise expressed, the set $\Omega$ of carriers is divided into a first subset of carriers $\Omega_{low}$, whereof the respective transmission coefficients are greater than a threshold value (weak fading) and a second subset $\Omega_{high}$ whereof the respective transmission coefficients are less than this threshold value (deep fading). More precisely, transmission on the channel between the relay terminal r and the destination terminal d can be represented by:

$$y_{rd} = H_{rd} x_r + n_{rd} \quad (1)$$

where $x_r$ is a dimension vector $N_c$ the components of which are the modulation symbols carried by the different carriers, $H_{rd} = \text{Diag}(\alpha_1, \ldots, \alpha_{N_c})$ is a diagonal matrix of size $N_c \times N_c$ whereof the diagonal elements are the transmission coefficients of the different carriers, $n_{rd}$ is a dimension vector $N_c$ of noise components, $y_{rd}$ is the vector of symbols received by the destination terminal d. The coefficients $\alpha_n$, $n=1, \ldots, N_c$ are compared to a predetermined threshold value $\alpha_T$. The following is defined:

$$\Omega_{low} = \{f_n | \alpha_n > \alpha_T\} \text{ and } \Omega_{high} = \{f_n | \alpha_n \leq \alpha_T\} \quad (2)$$

According to a variant, if the transmission coefficients have previously been the subject of quantification on L levels $\bar{\alpha}_1, \ldots, \bar{\alpha}_L$, the subsets $\Omega_{low}$ and $\Omega_{high}$ can be defined by:

$$\Omega_{low} = \bigcup_{\alpha_k > \alpha_T} \Omega_k \text{ and } \Omega_{high} = \bigcup_{\alpha_k \leq \alpha_T} \Omega_k \quad (3)$$

In all cases, the second parity bits $P_r$ are transmitted under more favourable conditions than the systematic bits $\hat{I}_r$. The idea at the basis of the invention is to guarantee at the same time, as far as possible, the dimension of the turbocode and the spatial diversity introduced by the relays. In fact, if it is supposed that the second parity bits cannot be decoded by the destination terminal due to deep fading, the benefit of interleaving and second convolutive coding is lost and the effective dimension of the turbocode is reduced.

The scheduling rule of the scheduler can be controlled in different ways.

According to a first variant, for example if the source terminal and the relay terminal are not arranged remotely from each other (the source-destination and relay-destination transmission channels are similar), the source terminal can determine by way of a channel quality indicator or CQI (Channel Quality Indicator) the frequencies affected by deep fading and deduce therefrom the subset $\Omega_{high}$ and its complementary $\Omega_{low}$. The information on the partition ($\Omega_{high}, \Omega_{low}$) can be transmitted by the source terminal to the relay terminal by means of an auxiliary channel (not shown). For example, a predetermined set of partitions of $\Omega$ can be indexed using partition information transmitted on the auxiliary channel. Alternatively, the partition information can be incorporated in a message header to be transmitted. It should be noted that the partition information must be transmitted anyway to the destination terminal. The latter must in fact know the scheduling rule utilised at the level of the relay terminal to be able to perform decoding.

According to a second variant, the scheduling rule can be controlled autonomously by the relay terminal. For example, if the relay terminal transmits data strictly for the destination terminal, which will frequently be the case if the latter is a base station, it could determine the partition $(\Omega_{high}, \Omega_{low})$ from the quality indicator (CQI) of the relay-destination channel. Alternatively, if the relay terminal receives data from the terminal destination, that is, on its downlink if the destination terminal is a base station, it could, assuming the channel is reciprocal, determine the attenuation coefficients of the different carriers due to the controlled symbols received and deduce therefrom the partition $(\Omega_{high}, \Omega_{low})$.

Figure 6:
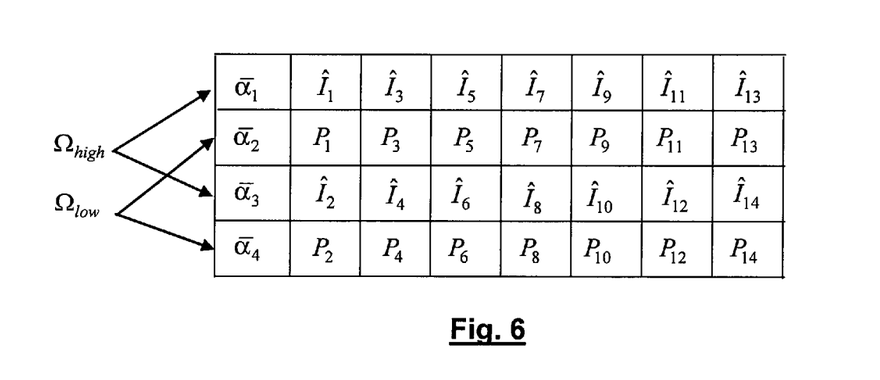
FIG. 6 gives an example of frequency scheduling for the turbocoder of FIG. 5.

FIG. 6 gives a frequency scheduling example for a transmission channel between the relay terminal r and the destination terminal d, with four instances $\bar{\alpha}_1 = 0.4$; $\bar{\alpha}_2 = 0.8$; $\bar{\alpha}_3 = 0.2$; $\bar{\alpha}_4 = 0.6$. The set $\Omega_{low}$ is constituted by carriers whereof the attenuation coefficient is quantified by $\bar{\alpha}_2$ or $\bar{\alpha}_4$. The set $\Omega_{high}$ is constituted by carriers whereof the attenuation coefficient is quantified by $\bar{\alpha}_1$ or $\bar{\alpha}_3$. It is presumed that the code word to be transmitted was constituted by 14 bits $I_1, \ldots, I_{14}$. The parity bits supplied by the coder $CC_r$ from the estimated values $\hat{I}_1, \ldots, \hat{I}_{14}$ are designated here by $P_{r1}, \ldots, P_{r14}$. The channel is supposed invariant during the transmission time of the code word. The scheduling table shows that the systematic bits $\hat{I}_1, \ldots, \hat{I}_{14}$ are distributed over the carriers belonging to the set $\Omega_{high}$ and that the parity bits $P_{r1}, \ldots, P_{r14}$ are distributed over the carriers belonging to the set $\Omega_{low}$.

The person skilled in the art will understand that the above-described embodiment can be generalised to a distributed turbocoder on any number of relay terminals. The source terminal as well as the relay terminals do not necessarily present a single dimension of the turbocode; in other words a single convolutive coding path, but can comprise a plurality of such paths. For example, if the cooperative communications system comprises a plurality of relay terminals $r_1, \ldots, r_J$, the total dimension of the turbocode will be $$D = 1 + \sum_{j=1}^{J} v_j$$

where $v_j$ is the number of paths of convolutive coding of the relay terminal $r_j$, and where the term 1 represents the systematic path.

From the receptor side of the destination terminal, the soft values of the systematic bits I, $\hat{I}_{r1}, \ldots, \hat{I}_{rJ}$ received respectively from the source terminal and the relay terminals are combined by means of MRC combining (Maximum Ratio Combining) to provide a composite soft value. The composite soft values of systematic bits as well as the soft values of the parity bits received respectively from the $$\sum_{j=1}^{J} v_j$$

paths of convolutive coding are decoded conventionally by means of a turbodecoder comprising as many elementary coders of SISO type (Soft Input Soft Output) or of MAP type (Maximum A Posteriori) as coding paths. Decoding is performed in a manner known per se by successive iterations, each decoder providing, at each iteration, to the other decoders the extrinsic information associated with the different bits for the following iteration. There is therefore no additional complexity relative to classic turbo-decoding.

The cooperative communications system of FIG. 5 functions well when the transmission channel between the source terminal and the destination terminal is not subject to deep fading. In the inverse case, it is preferred to utilise a cooperative communications system according to a second embodiment of the invention.

Figure 7:
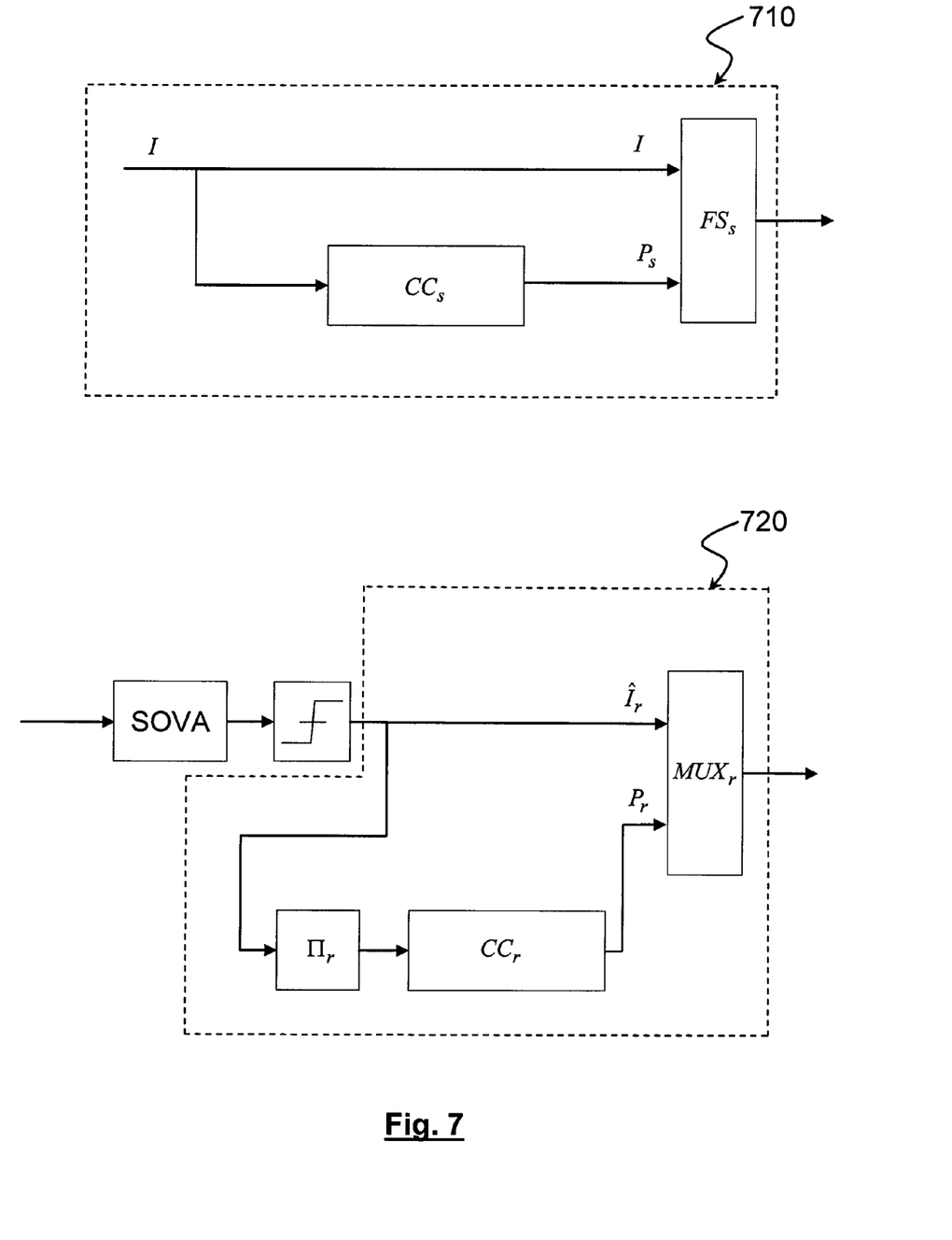
FIG. 7 schematically illustrates the structure of a distributed turbocoder with frequency scheduling according to a second variant embodiment of the invention.

FIG. 7 illustrates a distributed turbocoder according to a second embodiment of the invention. Inversely to the preceding embodiment, the frequency scheduling is performed here in the part 710 of the turbocoder residing on the source terminal, the second part, 720, residing on the relay terminal performing only multiplexing by selecting the estimated systematic bits $\hat{I}_r$ and the parity bits $P_r$ alternatively or randomly. The functioning of the frequency scheduler $FS_s$ is identical to that of the frequency scheduler $FS_r$ of the first embodiment, with the difference that it operates on the information systematic bits I and the parity bits $P_s$. In this embodiment, the partition $(\Omega_{high}, \Omega_{low})$ is determined by the source terminal itself. The information is however transmitted over an auxiliary channel or in a header, both to the relay terminal and to the destination terminal, both of which need to know the scheduling rule to be able to perform their respective decoding operations.

The second embodiment gives good results when the transmission channel between the relay terminal and the destination terminal is not subject to deep fading. Where the two source-destination and relay-destination transmission channels can be affected by fading, the third embodiment is preferred.

Figure 8:
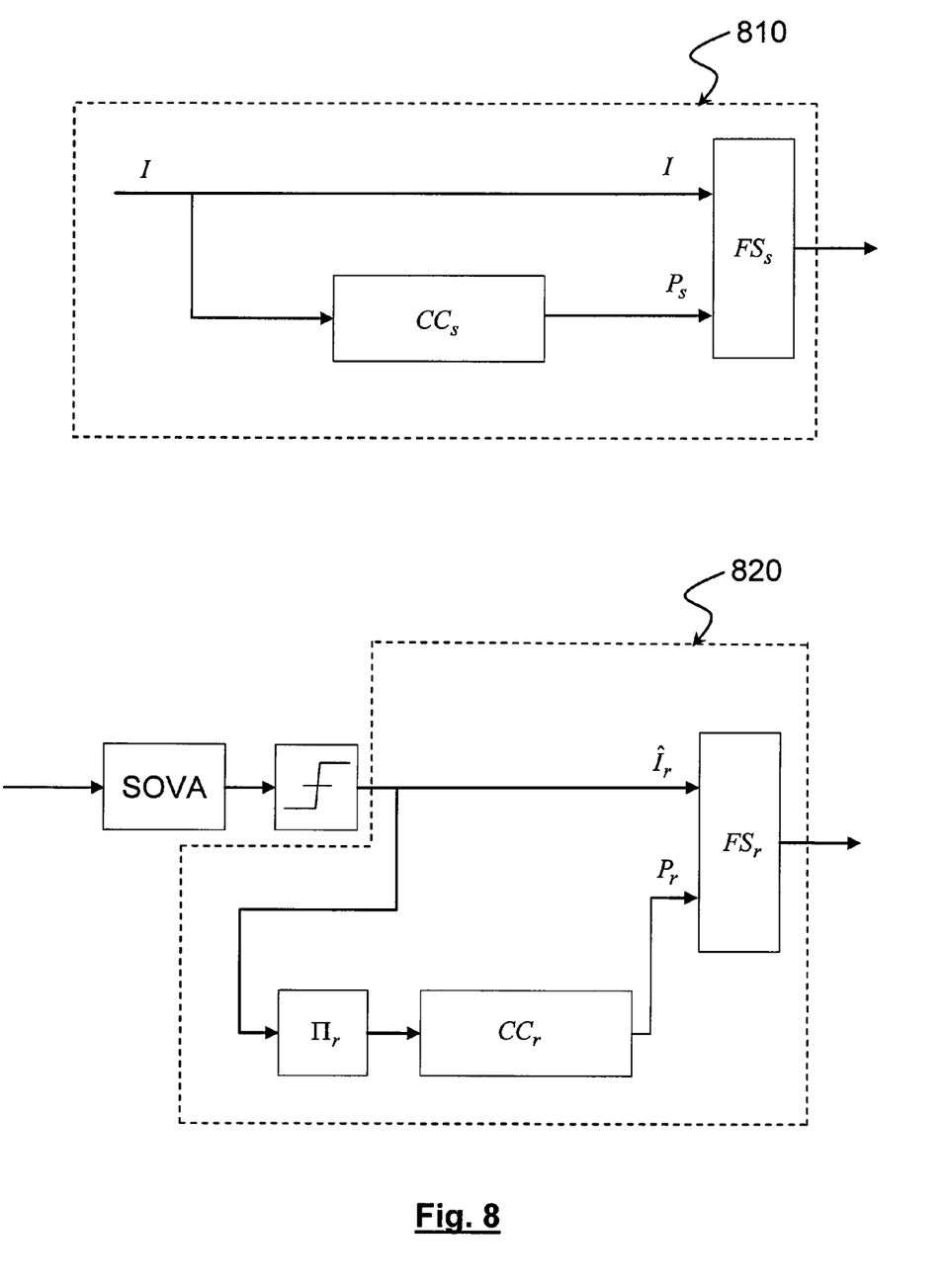
FIG. 8 schematically illustrates the structure of a distributed turbocoder with frequency scheduling according to a third variant embodiment of the invention.

FIG. 8 illustrates a distributed turbocoder according to a third embodiment of the invention. The first part of the turbocoder, 810, residing on the source terminal has the same structure in the second embodiment and the second part, 820, residing on the relay terminal, has the same structure as in the first embodiment. It is understood that the parity bits $P_s$ and $P_r$ are transmitted as privileged over the source-destination and relay-destination transmission channels to best preserve the dimension of the code.

The scheduling rule utilised in the scheduler $FS_s$ is determined by the source terminal as explained in the second embodiment. The scheduling rule utilised in the scheduler $FS_r$ is determined by the source terminal—this is the same as that utilised by $FS_s$—or autonomously by the relay terminal as explained in the first embodiment.

The $FS_s$ and/or $FS_r$ schedulers preferably utilise a dynamic scheduling rule which can for example be updated at each new code word or else according to a periodicity, depending upon the rapidity of evolution of the channel.

The invention claimed is:

1. A cooperative communications system comprising a source terminal (s), at least one relay terminal (r), and a destination terminal (d), the source terminal being adapted to transmit information data (I) to the destination terminal over a first multi-carrier transmission channel, said system comprising a distributed turbocoder over said source terminal and at least said relay terminal, the part of the turbocoder residing on the source terminal, referred to as first part (510, 710, 810), comprising a first systematic path and at least one first convolutive coding path ($CC_s$) coding said information data to generate first parity data ($P_s$), the relay terminal estimating said information data from a signal received from the source terminal, the part of the turbocoder residing on the relay terminal, referred to as second part (520, 720, 820), comprising a second systematic path providing the information data thus estimated ($\hat{I}_r$) and a second convolutive coding path ($CC_r$) coding the latter after having interleaved them to generate second parity data ($P_r$), said estimated data ($\hat{I}_r$) and said second parity data ($P_r$) being transmitted over a second multicarrier transmission channel, characterised in that said system comprises at least one frequency scheduler ($FS_s, FS_r$) residing on the source terminal or the relay terminal, said scheduler allocating the carriers ($\Omega_{high}$) exhibiting deep fading to the data originating respectively from the first or the second systematic path and the carriers exhibiting weak fading ($\Omega_{low}$) to the data originating respectively from the first or the second convolutive coding path.

2. The cooperative communications system as claimed in claim 1, characterised in that it comprises a first frequency scheduler ($FS_s$) residing on the source terminal and receiving at input said systematic information data (I) and said first parity data ($P_s$) and allocating the deep-fading carriers to the first and the weak-fading carriers to the second.

3. The cooperative communications system as claimed in claim 1, characterised in that it comprises a second frequency scheduler ($FS_r$) residing on the relay terminal and receiving at input said estimated systematic information data and said second parity data ($P_r$) and allocating the deep-fading carriers to the first and the weak-fading carriers to the second.

4. A cooperative communications device as claimed in claim 3, characterised in that the partition between weak-fading carriers ($\Omega_{low}$) and deep-fading carriers ($\Omega_{high}$) utilised by the second scheduler ($FS_r$)) is determined by the source terminal and in that information indicative of this partition is transmitted to the relay terminal.

5. The cooperative communications device as claimed in claim 4, characterised in that said partition is determined by the source terminal from a channel quality indicator (CQI) sent by the destination terminal.

6. The cooperative communications device as claimed in claim 3, characterised in that the partition between weak-fading carriers ($\Omega_{low}$) and deep-fading carriers ($\Omega_{high}$) utilised by the second scheduler is determined autonomously by the relay terminal.

7. The cooperative communications device as claimed in claim 6, characterised in that said partition is determined by the relay terminal from a channel quality indicator (CQI) sent by the destination terminal.

8. The cooperative communications device as claimed in claim 1, characterised in that the first and second multicarrier channels are OFDM channels.

* * * * *